United States Patent
Kobayakawa

(10) Patent No.: US 10,297,734 B2
(45) Date of Patent: *May 21, 2019

(54) LED MODULE

(71) Applicant: ROHM CO., LTD., Kyoto-shi, Kyoto (JP)

(72) Inventor: Masahiko Kobayakawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/667,148

(22) Filed: Aug. 2, 2017

(65) Prior Publication Data

US 2017/0331010 A1    Nov. 16, 2017

Related U.S. Application Data

(63) Continuation of application No. 14/275,319, filed on May 12, 2014, now Pat. No. 9,755,125.

(30) Foreign Application Priority Data

May 15, 2013 (JP) ................................. 2013-103127

(51) Int. Cl.
*H01L 33/62* (2010.01)
*H01L 33/48* (2010.01)
(Continued)

(52) U.S. Cl.
CPC .............. *H01L 33/62* (2013.01); *H01L 24/48* (2013.01); *H01L 33/486* (2013.01); *H01L 33/60* (2013.01);
(Continued)

(58) Field of Classification Search
CPC ....................................................... H01L 33/62
See application file for complete search history.

(56) References Cited

U.S. PATENT DOCUMENTS 6,504,107 B1    1/2003  Kragl
9,755,125 B2 *  9/2017  Kobayakawa .......... H01L 33/62
(Continued)

FOREIGN PATENT DOCUMENTS

JP    2012-28743    2/2012
JP    2012-54280    3/2012
(Continued)

OTHER PUBLICATIONS

Office Action received in the corresponding Japanese Patent application, Jan. 30, 2018, and corresponding English machine translation.

(Continued)

*Primary Examiner* — Peniel M Gumedzoe
*Assistant Examiner* — Christopher A Johnson
(74) *Attorney, Agent, or Firm* — Hamre, Schumann, Mueller & Larson, P.C.

(57) ABSTRACT

An LED module is provided with a lead, an LED chip mounted on the obverse surface of the lead, and a case covering at least a part of the lead. The case has a side wall surrounding the LED chip. The lead includes a thin extension whose bottom surface is spaced apart upward from the reverse surface of the lead in the thickness direction of the lead. The case is provided with a holding portion that covers at least a part of each of the top surface and the bottom surface of the first thin extension.

20 Claims, 16 Drawing Sheets

(51) Int. Cl.
  *H01L 23/00*  (2006.01)
  *H01L 33/60*  (2010.01)
(52) U.S. Cl.
  CPC ............... *H01L 2224/48091* (2013.01); *H01L 2224/48247* (2013.01)

(56) References Cited

U.S. PATENT DOCUMENTS

2008/0237627 A1* 10/2008 Kobayakawa ........ H01L 33/486
  257/99
2010/0072499 A1*  3/2010 Kwon ................... H01L 33/483
  257/98
2012/0267671 A1* 10/2012 Jung ..................... H01L 33/486
  257/99

FOREIGN PATENT DOCUMENTS

JP  2012-244086     12/2012
JP  2014-225512 A   12/2014

OTHER PUBLICATIONS

Office Action issued in counterpart Japanese application, dated Nov. 29, 2016, and corresponding English translation.

* cited by examiner

LED MODULE

BACKGROUND OF THE INVENTION

1. Field of the Invention

The present invention relates to an LED module.

2. Description of the Related Art

LED modules provided with LED chips are widely used as the light source modules of electronic devices. An example of a conventional LED module is disclosed in JP 2012-244086A. The LED module disclosed in this document includes two leads, an LED chip, a case and a sealing resin. The two leads may be made by press-working a metal plate. The LED chip is mounted on one of the two leads and connected to the other lead via a wire. The case is made of e.g. white resin. The case surrounds the LED chip and covers a part of each lead. The space surrounded by the case is filled with the sealing resin so that the LED chip and the wire are protected.

As electronic devices are being reduced in size and their components are being arranged at a higher density, there is an increasing demand for size reduction of LED modules. In a small LED module, the contact area between the lead and the case is small. When the contact area is small, the lead may be unduly separated from the case as a result of repetitive heat generation during the use of the LED module or application of heat or stress in the process of mounting the LED module to manufacture an electronic device.

SUMMARY OF THE INVENTION

The present invention has been conceived under the above-described circumstances. It is therefore an object of the present invention to provide an LED module that can be reduced in size.

According to an embodiment of the present invention, there is provided an LED module is provided with: a first lead including an obverse surface and a reverse surface that are spaced apart from each other in a thickness direction of the lead and face in mutually opposite directions; an LED chip mounted on the obverse surface of the first lead; and a case covering at least a part of the first lead and including a side wall surrounding the LED chip. The first lead includes a first thin extension including a bottom surface and a top surface that face in mutually opposite directions, and the bottom surface of the first thin extension is spaced apart from the reverse surface of the first lead in the thickness direction. The case includes a first holding portion that covers at least a part of each of the top surface and the bottom surface of the first thin extension.

Preferably, the top surface of the first thin extension is flush with the obverse surface of the first lead.

Preferably, the first holding portion is in a form of a round column.

Preferably, the first holding portion includes a part thereof that is positioned on an inner side of the side wall.

Preferably, the first holding portion and the side wall have surfaces that face in a same direction as the obverse surface of the first lead and are flush with each other.

Preferably, the first holding portion covers an end of the first thin extension.

Preferably, the side wall is rectangular as viewed in the thickness direction, and the first holding portion is positioned at a corner of the side wall.

Preferably, the LED module of an embodiment of the present invention is further provided with a second lead spaced apart from the first lead, where the second lead includes an obverse surface and a reverse surface, and the obverse surface of the second lead is connected to the LED chip via a wire. The second lead includes a second thin extension including a top surface and a bottom surface that face in mutually opposite directions, and the bottom surface of the second thin extension is spaced apart from the reverse surface of the second lead in the thickness direction. The case includes a second holding portion that covers at least a part of each of the top surface and the bottom surface of the second thin extension.

Preferably, the top surface of the second thin extension is flush with the obverse surface of the second lead.

Preferably, the second holding portion is in a form of a round column.

Preferably, the second holding portion includes a part thereof positioned on an inner side of the side wall.

Preferably, the second holding portion and the side wall have surfaces that face in a same direction as the obverse surface of the second lead and are flush with each other.

Preferably, the second holding portion covers an end of the second thin extension.

Preferably, the side wall is rectangular as viewed in the thickness direction, and the second holding portion is positioned at a corner of the side wall.

Preferably, the case is formed with an additional first holding portion that covers at least a part of each of the top surface and the bottom surface of the first thin extension.

Preferably, the case is formed with an additional second holding portion that covers at least a part of each of the top surface and the bottom surface of the second thin extension.

Preferably, the case is formed with an additional first holding portion and an additional second holding portion, where the additional first holding portion covers at least a part of each of the top surface and the bottom surface of the first thin extension, and the additional second holding portion covers at least a part of each of the top surface and the bottom surface of the second thin extension.

Preferably, the first lead is formed with a first through-hole penetrating in the thickness direction.

Preferably, the first through-hole includes an inner edge adjacent to the obverse surface of the first lead, and the first lead includes an eaved portion projecting inward from the inner edge of the first through-hole.

Preferably, the first through-hole overlaps the side wall of the case as viewed in the thickness direction.

Preferably, the first through-hole includes apart thereof positioned on an inner side of the side wall as viewed in the thickness direction.

Preferably, the first through-hole includes apart thereof positioned on an outer side of the side wall as viewed in the thickness direction.

Preferably, the first through-hole is oval.

Preferably, the second lead is formed with a second through-hole penetrating in the thickness direction.

Preferably, the second through-hole includes an inner edge adjacent to the obverse surface of the second lead, and the second lead includes an eaved portion projecting inward from the inner edge of the second through-hole.

Preferably, the second through-hole overlaps the side wall of the case as viewed in the thickness direction.

Preferably, the second through-hole includes a part thereof positioned on an inner side of the side wall as viewed in the thickness direction.

Preferably, the second through-hole includes a part thereof positioned on an outer side of the side wall as viewed in the thickness direction.

Preferably, the second through-hole is oval.

According to an embodiment of the present invention, the first lead is held by the first holding portion, with the top surface and the bottom surface of the first thin extension covered by the first holding portion. Thus, undesired separation of the first lead from the case is prevented, which enables size reduction of the LED module.

Other features and advantages of the present invention will become apparent from the detailed description given below with reference to the accompanying drawings.

DETAILED DESCRIPTION OF THE PREFERRED EMBODIMENTS

Preferred embodiments of the present invention are described below with reference to the accompanying drawings.

Figure 1:
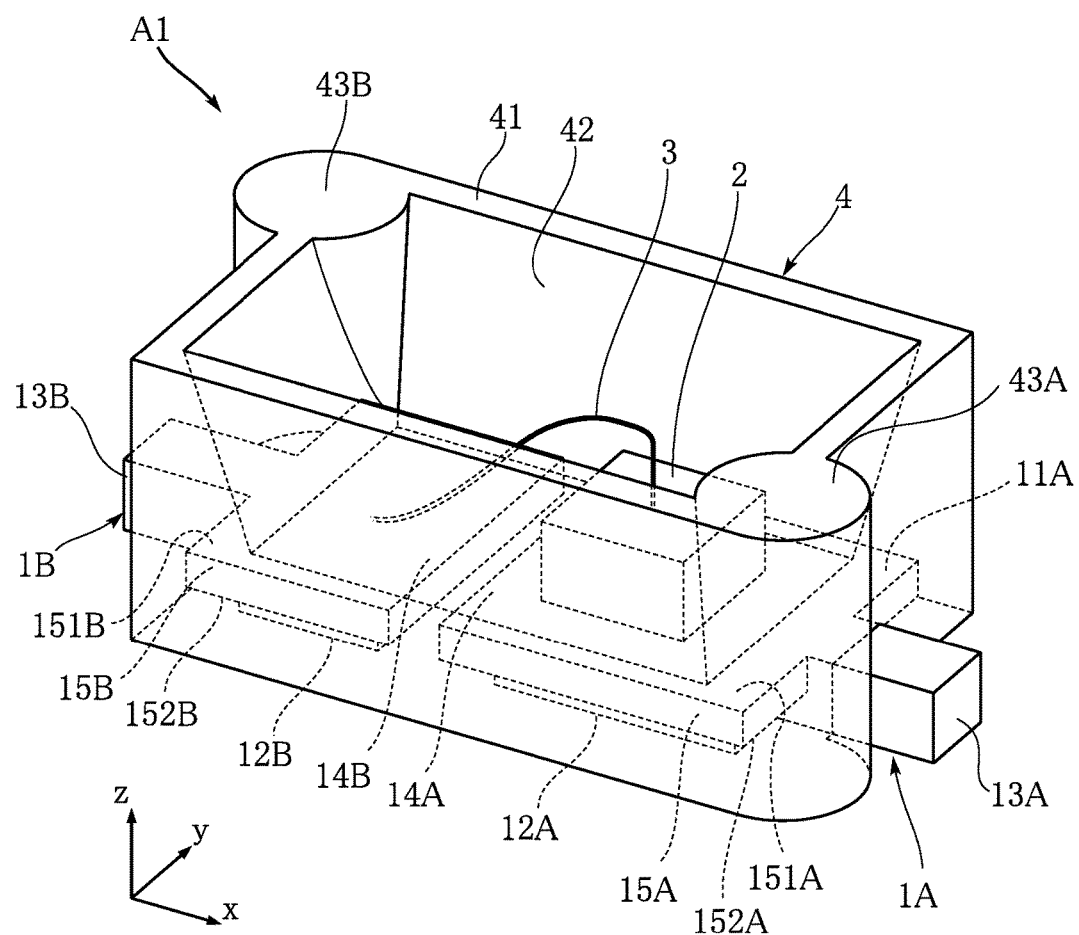
FIG. 1 is a schematic perspective view of an LED module according to a first embodiment of the present invention.
Figure 2:
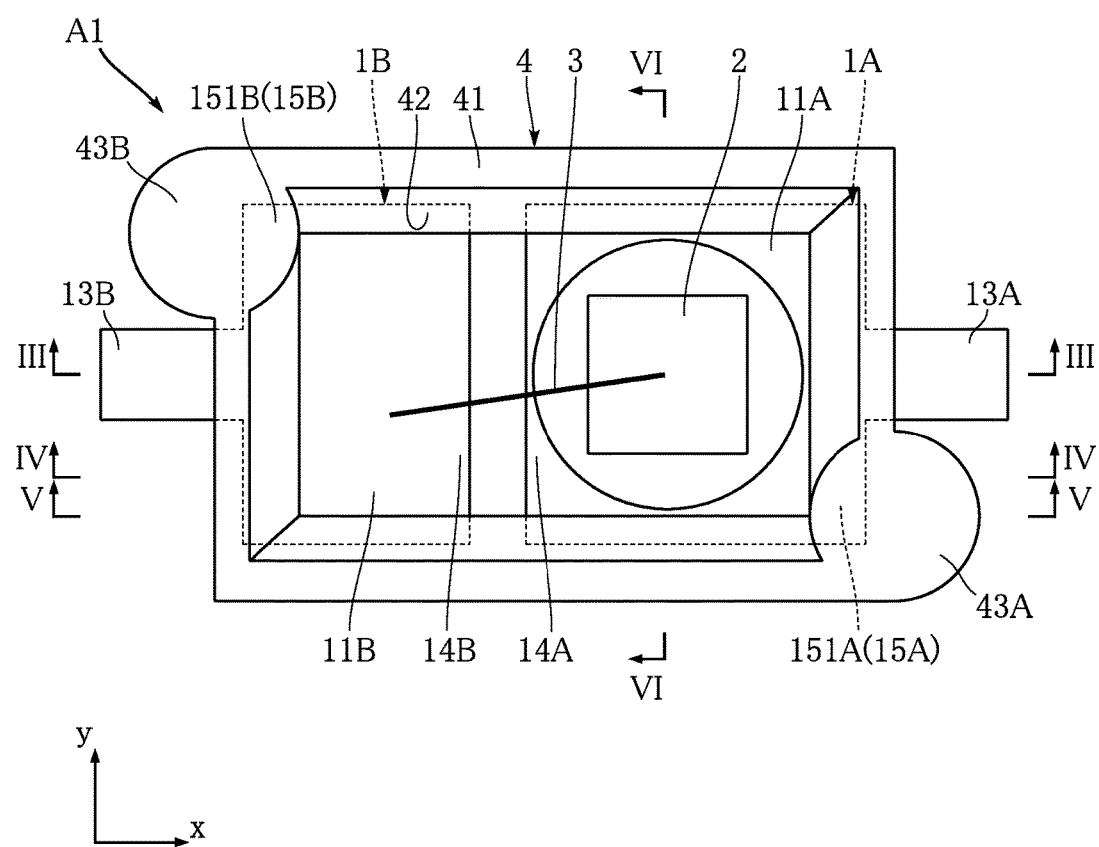
FIG. 2 is a schematic plan view of the LED module of FIG. 1.

FIGS. 1-6 show an LED module according to a first embodiment of the present invention. The LED module A1 of this embodiment includes a first lead 1A, a second lead 1B, an LED chip 2, a wire 3, a case 4 and a sealing resin 5. In FIGS. 1 and 2, the sealing resin 5 is not shown for the sake of simplicity of illustration.

The LED module A1 in this embodiment is very small in size. For instance, the LED module A1 is about 1.6 mm in the direction x and about 0.8 mm in the direction y.

The first lead 1A is made of metal such as Cu, Ni or alloys of these metals. The first lead 1A includes an obverse surface 11A, a reverse surface 12A, a projecting portion 13A, an eaved portion 14A and a first thin extension 15A. In this embodiment, the first lead 1A (except for the projecting portion 13A) is generally rectangular as viewed in the direction z.

The obverse surface 11A faces upward in the direction z, while the reverse surface 12A faces downward in the direction z. That is, the obverse surface 11A and the reverse surface 12A face away from each other, in other words, face in the mutually opposite directions. The obverse surface 11A is used for mounting the LED chip 2. The reverse surface 12A is used for mounting the LED module A1 on e.g. an electronic device in a manner such that the surface 12A is held in contact with e.g. a corresponding wiring portion of the device.

The projecting portion 13A projects to the right in the direction x. In this embodiment, the projecting portion 13A is in the form of a bar that is rectangular in cross section. In mounting the LED module A1, the projecting portion 13A serves to promote the formation of a solder fillet.

Figure 3:
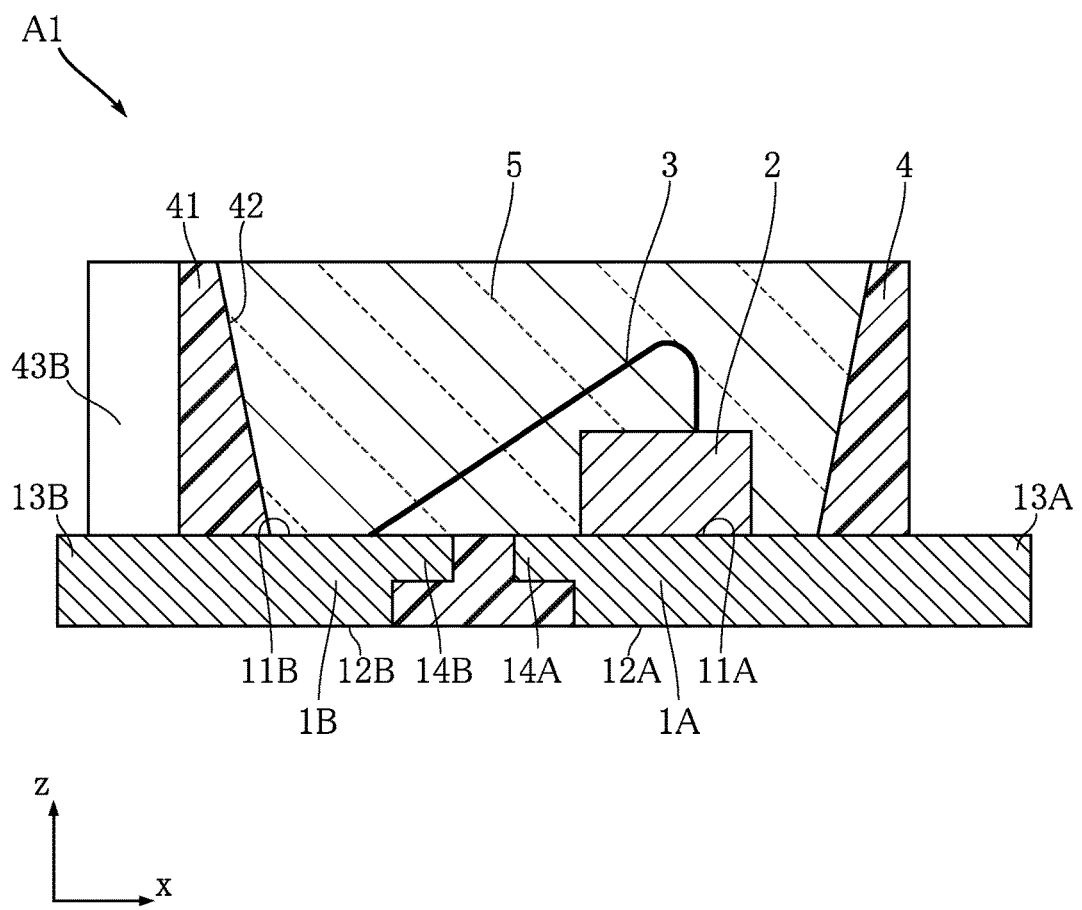
FIG. 3 is a sectional view taken along lines III-III in FIG. 2.
Figure 4:
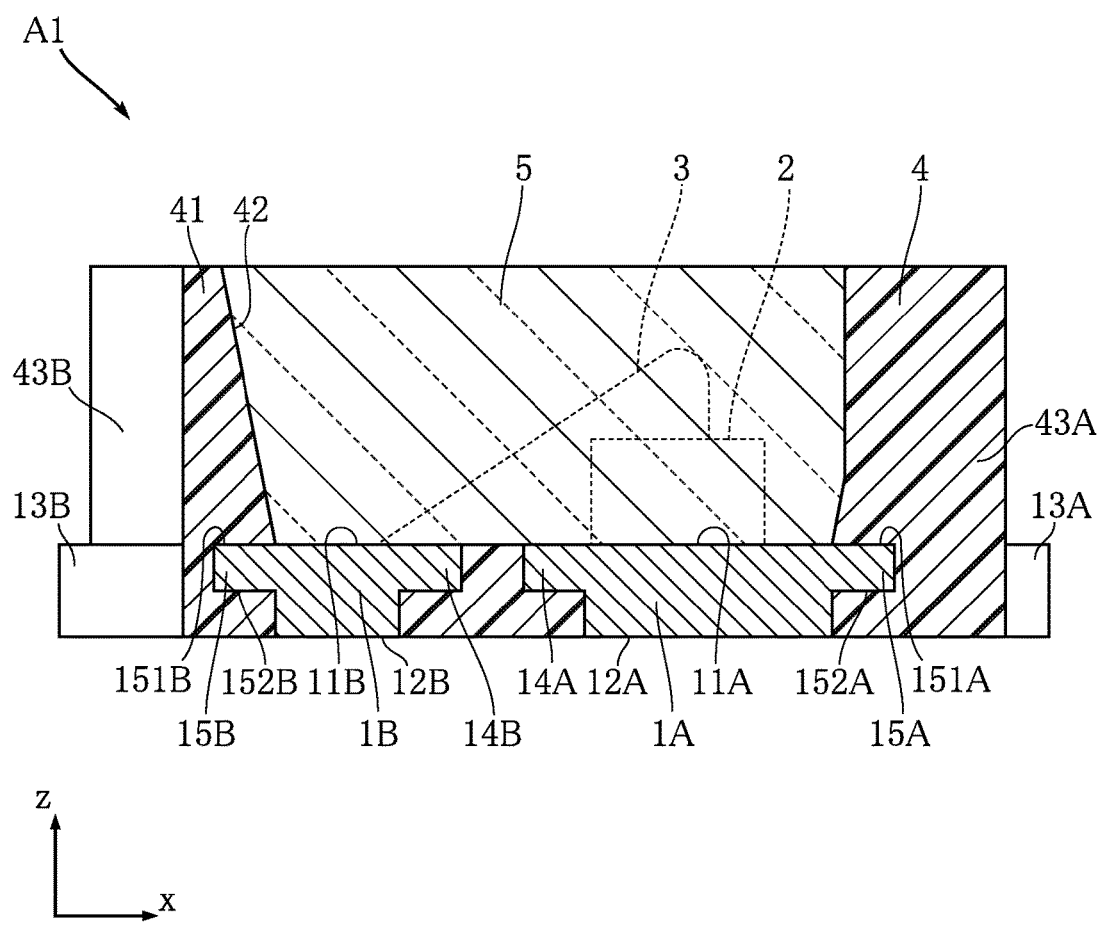
FIG. 4 is a sectional view taken along lines IV-IV in FIG. 2.
Figure 5:
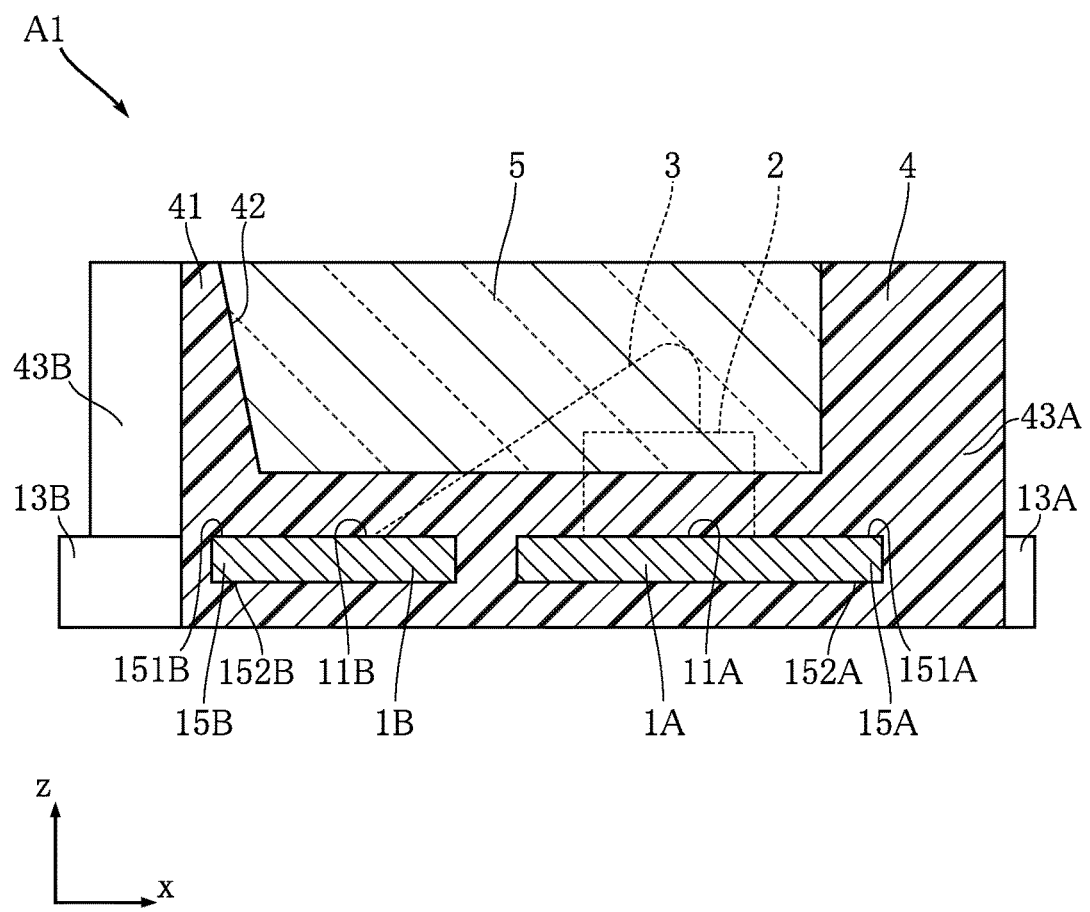
FIG. 5 is a sectional view taken along lines V-V in FIG. 2.
Figure 6:
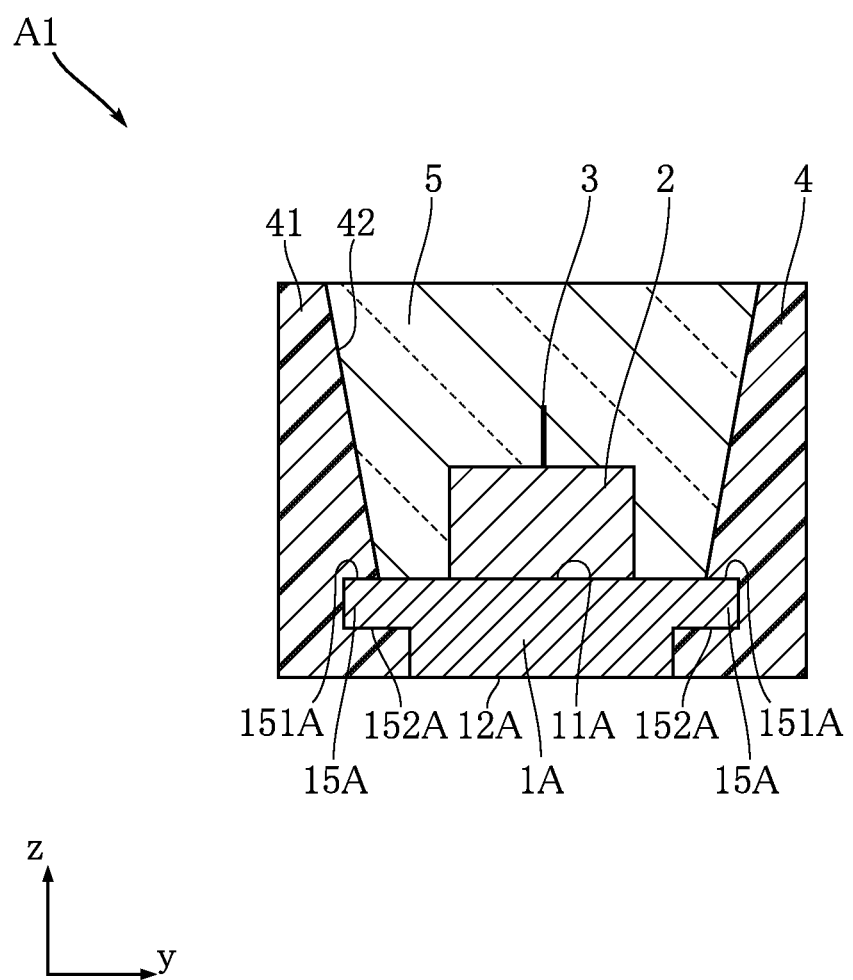
FIG. 6 is a sectional view taken along lines VI-VI in FIG. 2.

The eaved portion 14A is the portion projecting to the left in the direction x. As shown in FIGS. 1 and 3, the eaved portion 14A is smaller in thickness than the adjacent, main portion (or thick portion) that has a constant thickness greater than that of the eaved portion 14A. The eaved portion 14A provides a part of the obverse surface 11A. In other words, the upper surface of the eaved portion 14A constitutes a part of the obverse surface 11A. The lower surface of the eaved portion 14A is retreated from the reverse surface 12A upward in the direction z, so that the lower surface does not constitute any part of the reverse surface 12A.

In this embodiment, the first thin extension 15A projects from the main thick portion to the both sides in the direction y and also to the right in the direction x. The first thin extension 15A has a top surface 151A and a bottom surface 152A. The top surface 151A faces upward in the direction z similarly to the obverse surface 11A and is flush with the obverse surface 11A. The bottom surface 152A faces downward in the direction z similarly to the reverse surface 12A and is retreated from the reverse surface 12A upward in the direction z. The first thin extension 15A is smaller in thickness than the adjacent main portion.

In the first thin extension 15A, the portions extending to the opposite sides in the direction y are configured to be elongated along two sides of the main portion of the first lead 1A which are parallel to the direction x. The portion extending to the right in the direction x is configured to be elongated along a side of the main portion of the first lead 1A which is parallel to the direction y, and the portion extending to the right sandwiches the projecting portion 13A in the direction y.

The second lead 1B is made of metal such as Cu, Ni or alloys of these metals. The second lead 1B includes an obverse surface 11B, a reverse surface 12B, a projecting portion 13B, an eaved portion 14B and a second thin extension 15B. In this embodiment, the second lead 1B (except for the projecting portion 13B) is generally rectangular as viewed in the direction z.

The obverse surface 11B faces upward in the direction z. The reverse surface 12B faces downward in the direction z. That is, the obverse surface 11B and the reverse surface 12B face away from each other. The obverse surface 11B is used for bonding the wire 3. The reverse surface 12B is used for mounting the LED module A1 on e.g. an electronic device, as noted above with respect to the reverse surface 12A.

The projecting portion 13B projects to the left in the direction x. In this embodiment, the projecting portion 13B is in the form of a bar that is rectangular in cross section. In mounting the LED module A1, the projecting portion 13B serves to promote the formation of a solder fillet.

The eaved portion 14B is the portion extending to the right in the direction x. As shown in FIGS. 1 and 3, the eaved portion 14B is smaller in thickness than the adjacent, main portion (or thick portion) that has a constant thickness greater than that of the eaved portion 14B. The eaved portion 14B provides a part of the obverse surface 11B. In other words, the upper surface of the eaved portion constitutes a part of the obverse surface 11B. The lower surface of the eaved portion 14B is retreated from the reverse surface 12B upward in the direction z, so that the lower surface does not constitute any part of the reverse surface 12B.

In this embodiment, the second thin extension 15B extends from the main thick portion to the both sides in the direction y and also to the left in the direction x. The second thin extension 15B has a top surface 151B and a bottom surface 152B. The top surface 151B faces upward in the direction z similarly to the obverse surface 11B and is flush with the obverse surface 11B. The bottom surface 152B faces downward in the direction z similarly to the reverse surface 12B and is retreated from the reverse surface 12B upward in the direction z. The second thin extension 15B is smaller in thickness than the adjacent main portion.

In the second thin extension 15B, the portions extending to the opposite sides in the direction y are configured to be elongated along two sides of the main portion of the second lead 1B which are parallel to the direction x. The portion extending to the left in the direction x is configured to be elongated along a side of the main portion of the second lead 1B which is parallel to the direction y, and the portion extending to the left sandwiches the projecting portion 13B in the direction y.

The LED chip 2 is the light-emitting portion of the LED module A1 and structured as a single-wire type LED chip. The LED chip 2 is formed with an electrode on each of the upper surface and the lower surface in the direction z. The wire 3 is bonded to the electrode on the upper surface. The electrode on the lower surface is bonded to the obverse surface 11A of the first lead 1A via a conductive bonding material. The LED chip 2 comprises lamination of a plurality of semiconductor layers and emits e.g. blue light, red light or green light depending on the materials for the semiconductor layers.

The case 4 is made of e.g. white epoxy resin or silicone resin. The case 4 covers part of each of the first lead 1A and the second lead 1B and surrounds the LED chip 2. The case 4 has a side wall 41, a first holding portion 43A and a second holding portion 43B.

The side wall 41 surrounds the LED chip 2 and is in the form of a rectangle elongated in the direction x as viewed in the direction z. The side wall 41 has an inner side surface 42. The inner side surface 42 includes two pairs of opposite faces. In this embodiment, the inner side surface 42 is inclined in such a manner that the distance between the opposite faces of each pair increases as proceeding further away from the obverse surface 11A of the first lead 1A or the obverse surface 11B of the second lead 1B in the direction z.

In the space surrounded by the side wall 41, part of the obverse surface 11A of the first lead 1A and part of the obverse surface 11B of the second lead 1B are exposed. The reverse surface 12A of the first lead 1A and the reverse surface 12B of the second lead 1B are entirely exposed from the case 4. The projecting portion 13A of the first lead 1A and the projecting portion 13B of the second lead 1B project from the case 4. The case 4 covers the lower surfaces in the direction z and end surfaces facing in the direction x of the eaved portions 14A and 14B.

The first holding portion 43A includes a bulging portion of the case 4. In this embodiment, the first holding portion 43A is in the form of a round column having a central axis extending in the direction z. Referring to FIG. 2, the first holding portion 43A is provided at the lower right corner of the rectangular side wall 41.

Part of the first holding portion 43A is positioned on the inner side of the side wall 41, and part of the first holding portion 43A is positioned on the outer side of the side wall 41. The upper surface of the first holding portion 43A in the direction z is flush with the upper surface of the side wall 41 in the direction z.

The first holding portion 43A covers a part of the portion of the first thin extension 15A which extends to the right in the direction x in FIG. 2 and a part of the portion of the first thin extension 15A which extends downward in the direction y in FIG. 2. That is, the first holding portion 43A covers the top surface 151A and the bottom surface 152A of these portions of the first thin extension 15A. Further, the first holding portion 43A covers an end or tip of a prescribed portion of the first thin extension 15A. In the illustrated example, the first holding portion 43A covers a corner of the first thin extension 15A.

The second holding portion 43B comprises a bulging portion of the case 4. In this embodiment, the second holding portion 43B is in the form of a round column having a central axis extending in the direction z. Referring to FIG. 2, the second holding portion 43B is provided at the upper left corner of the rectangular side wall 41.

Part of the second holding portion 43B is positioned on the inner side of the side wall 41, and part of the second holding portion 43B is positioned on the outer side of the side wall 41. The upper surface of the second holding portion 43B in the direction z is flush with the upper surface of the side wall 41 in the direction z.

The second holding portion 43B covers a part of the portion of the second thin extension 15B which extends to the left in the direction x in FIG. 2 and a part of the portion of the second thin extension 15B which extends upward in the direction y in FIG. 2. That is, the second holding portion 43B covers the top surface 151B and the bottom surface 152B of these portions of the second thin extension 15B. Further, the second holding portion 43B covers an end or tip of a prescribed portion of the second thin extension 15B. In the illustrated example, the second holding portion 43B covers a corner of the second thin extension 15B.

The sealing resin 5 is made of a resin such as epoxy resin or silicone resin which transmits light from the LED chip 2. The sealing resin 5 fills the space surrounded by the side wall 41 of the case 4 and covers the LED chip 2 and the wire 3. The sealing resin 5 may be transparent. The sealing resin 5 may contain a fluorescent material that emits light of a certain color when excited by the light from the LED chip 2.

The advantages of the LED module A1 are described below.

According to this embodiment, the first lead 1A is held by the first holding portion 43A, with the top surface 151A and the bottom surface 152A of the first thin extension 15A covered by the first holding portion 43A. Thus, separation of the first lead 1A from the case 4 is prevented. This leads to size reduction of the LED module A1.

Since the first holding portion 43A covers a tip of a prescribed portion of the first thin extension 15A, part of the first thin extension 15A is surrounded by the first holding portion 43A vertically in the direction z and in the direction x or the direction y. This is advantageous for preventing separation of the first lead 1A.

The first holding portion 43A is in the form of a round column and the upper surface of the first holding portion 43A in the direction z is flush with the upper surface of the side wall 41 in the direction z. According to this arrangement, in molding the case 4, an ejector pin can be brought into contact with these upper surfaces in the direction z.

Since the first holding portion 43A has a portion positioned on the inner side of the side wall 41 and a portion positioned on the outer side of the side wall 41, a sufficiently large area for coming into contact with an ejector pin is provided.

Making the side wall 41 rectangular as viewed in the direction z and arranging the first holding portion 43A at a corner of the side wall 41 allows the first holding portion 43A to be made to have a relatively large volume while avoiding interference with the LED chip 2. This is advantageous for reliably preventing separation of the first lead 1A.

The second lead 1B is held by the second holding portion 43B, with the top surface 151B and the bottom surface 152B of the second thin extension 15B covered by the second holding portion 43B. Thus, separation of the second lead 1B from the case 4 is prevented. This leads to size reduction of the LED module A1.

Since the second holding portion 43B covers a tip of a prescribed portion of the second thin extension 15B, part of the second thin extension 15B is surrounded by the second holding portion 43B vertically in the direction z and in the direction x or the direction y. This is advantageous for preventing separation of the second lead 1B.

The second holding portion 43B is in the form of a round column and the upper surface of the second holding portion 43B in the direction z is flush with the upper surface of the side wall 41 in the direction z. According to this arrangement, in molding the case 4, an ejector pin can be brought into contact with these upper surfaces in the direction z.

Since the second holding portion 43B has a portion positioned on the inner side of the side wall 41 and a portion positioned on the outer side of the side wall 41, a sufficiently large area for coming into contact with an ejector pin is provided.

Making the side wall 41 rectangular as viewed in the direction z and arranging the second holding portion 43B at a corner of the side wall 41 allows the second holding portion 43B to be made to have a relatively large volume while avoiding interference with the LED chip 2. This is advantageous for reliably preventing separation of the second lead 1B.

FIGS. 7-16 show other embodiments of the present invention. In these figures, the elements that are identical or similar to those of the foregoing embodiments are designated by the same reference signs as those used for the foregoing embodiment.

Figure 7:
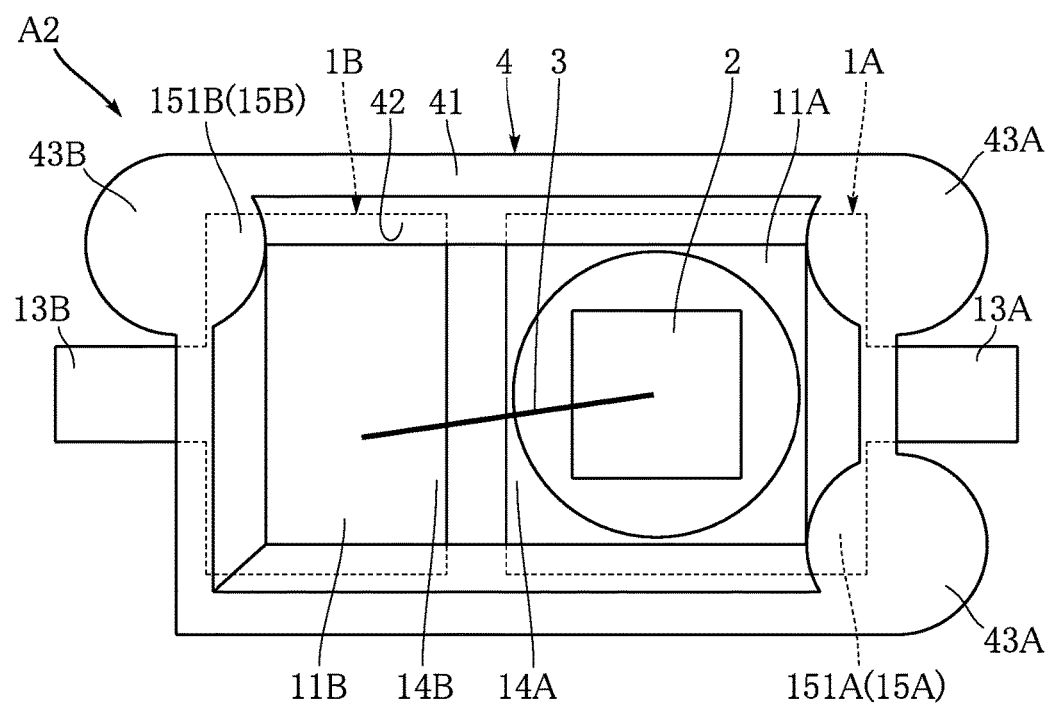
FIG. 7 is a schematic plan view of an LED module according to a second embodiment of the present invention.

FIG. 7 shows an LED module according to a second embodiment of the present invention. The LED module A2 of this embodiment has a case 4 formed with two first holding portions 43A and a single second holding portion 43B. FIG. 7 is a schematic plan view of the LED module A2. In FIG. 7, illustration of the sealing resin 5 is omitted.

The two first holding portions 43A are provided at the two right corners of the rectangular side wall 41 of the case 4 in the direction x in FIG. 7. Each of the two first holding portions 43A is in the form of a round column having a central axis extending in the direction z.

Part of each first holding portion 43A is positioned on the inner side of the side wall 41. Part of each first holding portion 43A is positioned on the outer side of the side wall 41. The upper surfaces of the two first holding portions 43A in the direction z are flush with the upper surface of the side wall 41 in the direction z.

Each of the two first holding port ions 43A covers the portion of the first thin extension 15A which extends to the right in the direction x in FIG. 7 and the portion of the first thin extension 15A which extends to each side in the direction y in FIG. 7. That is, the first holding portions 43A cover the top surface 151A and the bottom surface 152A of these portions of the first thin extension 15A. Each of the first holding portions 43A also covers a tip of a prescribed portion of the first thin extension 15A.

Referring to FIG. 7, the second holding portion 43B is provided at the upper left corner of the rectangular side wall 41. The second holding portion 43B is in the form of a round column having a central axis extending in the direction z.

Part of the second holding portion 43B is positioned on the inner side of the side wall 41, and part of the second holding portion 43B is positioned on the outer side of the side wall 41. The upper surface of the second holding portion 43B in the direction z is flush with the upper surface of the side wall 41 in the direction z.

The second holding portion 43B partially covers the portion of the second thin extension 15B which extends to the left in the direction x in FIG. 7 and the portion of the second thin extension 15B which extends upward in the direction y in FIG. 7. That is, the second holding portion 43B covers the top surface 151B and the bottom surface 152B of these portions of the second thin extension 15B. The second holding portion 43B also covers a tip of a prescribed portion of the second thin extension 15B.

According to this embodiment again, separation of the first lead 1A and the second lead 1B from the case 4 is prevented. This leads to size reduction of the LED module A2.

By providing two first holding portions 43A, separation of the first lead 1A is more reliably prevented. Arranging the two first holding portions 43A at two corners of the side wall 41 prevents interference of the LED chip 2 with the two first holding portions 43A.

Figure 8:
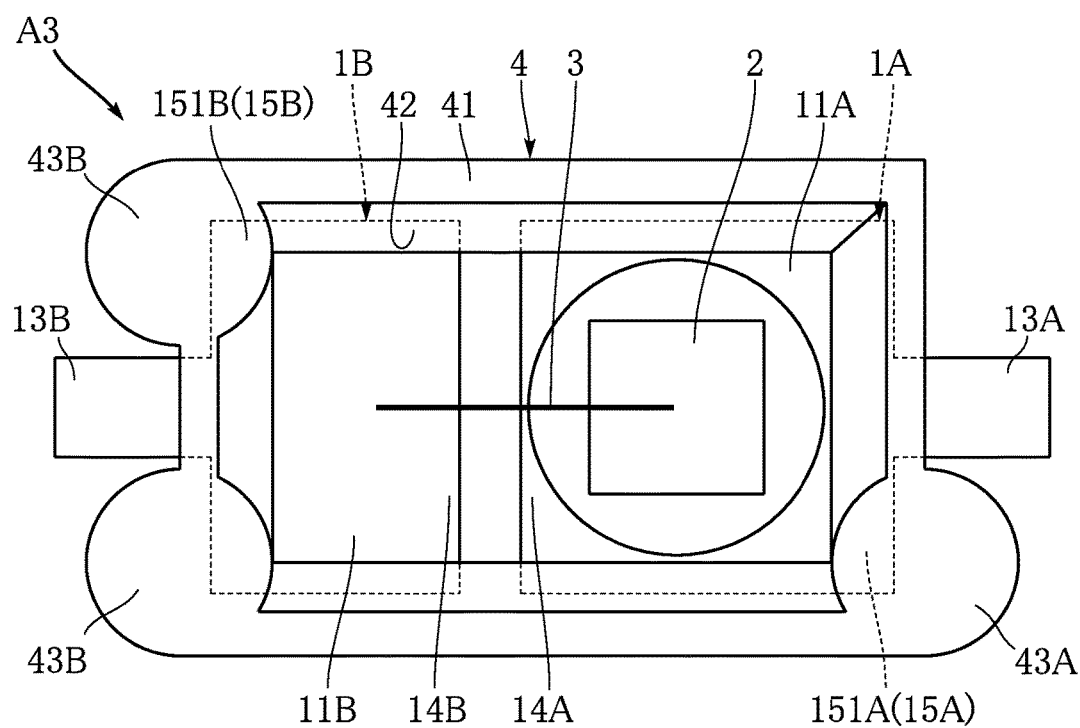
FIG. 8 is a schematic plan view of an LED module according to a third embodiment of the present invention.

FIG. 8 shows an LED module according to a third embodiment of the present invention. The LED module A3 of this embodiment has a case 4 formed with a single first holding portion 43A and two second holding portions 43B. FIG. 8 is a schematic plan view of the LED module A3. In FIG. 8, illustration of the sealing resin 5 is omitted.

Referring to FIG. 8, the first holding portion 43A is provided at the lower right corner of the rectangular side wall 41 of the case 4. The first holding portion 43A is in the form of a round column having a central axis extending in the direction z.

Part of the first holding portion 43A is positioned on the inner side of the side wall 41, and part of the first holding portion 43A is positioned on the outer side of the side wall 41. The upper surface of the first holding portion 43A in the direction z is flush with the upper surface of the side wall 41 in the direction z.

The first holding portion 43A partially covers the portion of the first thin extension 15A which extends to the right in the direction x in FIG. 8 and the portion of the first thin extension 15A which extends downward in the direction y in FIG. 8. That is, the first holding portion 43A covers the top surface 151A and the bottom surface 152A of these portions of the first thin extension 15A. The first holding portion 43A also covers a corner of the first thin extension 15A.

The two second holding portions 43B are provided at the two left corners of the rectangular side wall 41 of the case 4 in the direction x in FIG. 8. Each of the two second holding portions 43B is in the form of a round column having a central axis extending in the direction z.

Part of each second holding portion 43B is positioned on the inner side of the side wall 41. Part of each second holding portion 43B is positioned on the outer side of the side wall 41. The upper surfaces of the two second holding portions 43B in the direction z are flush with the upper surface of the side wall 41 in the direction z.

Each of the two second holding portions 43B partially covers the portion of the second thin extension 15B which extends to the left in the direction x in FIG. 8 and the portion of the second thin extension 15B which extends to each side in the direction y in FIG. 8. That is, the second holding portions 43B cover the top surface 151B and the bottom surface 152B of these portions of the second thin extension 15B. Each of the second holding portions 43B also covers a tip of a prescribed portion of the second thin extension 15B.

According to this embodiment again, separation of the first lead 1A and the second lead 1B from the case 4 is prevented. This leads to size reduction of the LED module A3.

By providing two second holding portions 43B, separation of the second lead 1B is more reliably prevented. Arranging the two second holding portions 43B at two corners of the side wall 41 prevents interference of the above-described capillary with the two second holding portions 43B.

Figure 9:
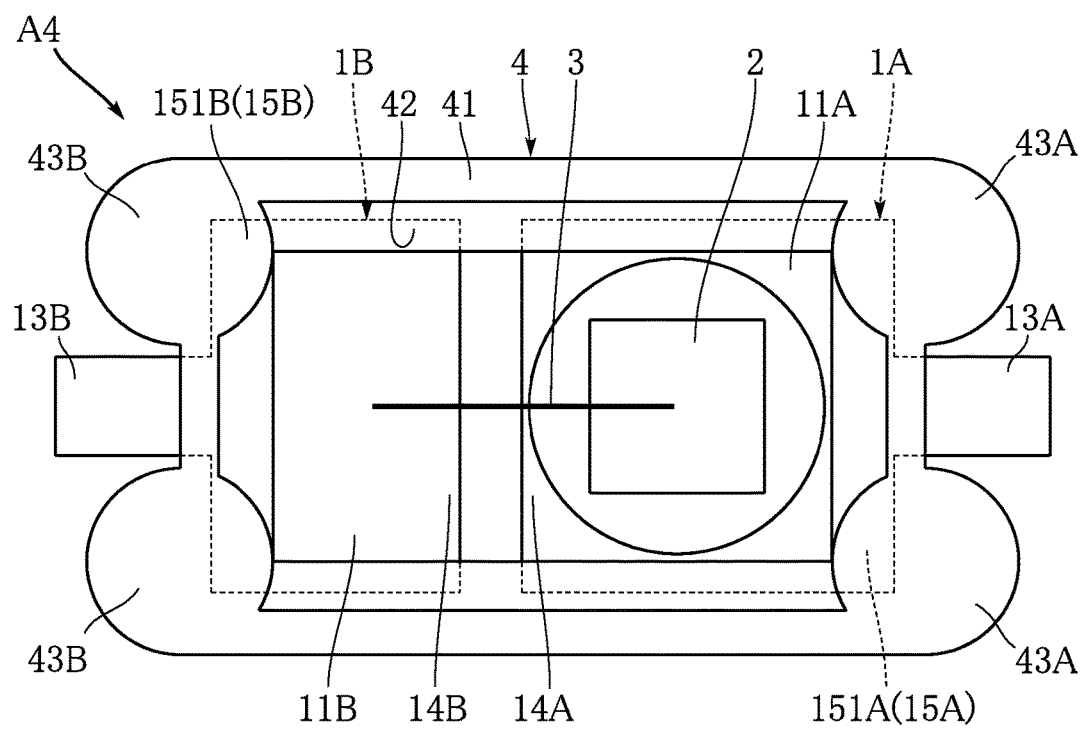
FIG. 9 is a schematic plan view of an LED module according to a fourth embodiment of the present invention.

FIG. 9 shows an LED module according to a fourth embodiment of the present invention. The LED module A4 of this embodiment has a case 4 formed with two first holding portions 43A and two second holding portions 43B. FIG. 9 is a schematic plan view of the LED module A4. In FIG. 9, illustration of the sealing resin 5 is omitted.

The two first holding portions 43A are provided at the two right corners of the rectangular side wall 41 of the case 4 in the direction x in FIG. 9. Each of the two first holding portions 43A is in the form of a round column having a central axis extending in the direction z.

Part of each first holding portion 43A is positioned on the inner side of the side wall 41. Part of each first holding portion 43A is positioned on the outer side of the side wall 41. The upper surfaces of the two first holding portions 43A in the direction z are flush with the upper surface of the side wall 41 in the direction z.

Each of the two first holding portions 43A partially covers a portion of the first thin extension 15A which extends to the right in the direction x in FIG. 9 and the portion of the first thin extension 15A which extends to each side in the direction y in FIG. 9. That is, the first holding portions 43A cover the top surface 151A and the bottom surface 152A of these portions of the first thin extension 15A. Each of the first holding portions 43A also covers a tip of a prescribed portion of the first thin extension 15A.

The two second holding portions 43B are provided at the two left corners of the rectangular side wall 41 of the case 4 in the direction x in FIG. 9. Each of the two second holding portions 43B is in the form of a round column having a central axis extending in the direction z.

Part of each second holding portion 43B is positioned on the inner side of the side wall 41. Part of each second holding portion 43B is positioned on the outer side of the side wall 41. The upper surfaces of the two second holding portions 43B in the direction z are flush with the upper surface of the side wall 41 in the direction z.

Each of the two second holding portions 43B partially covers the portion of the second thin extension 15B which extends to the left in the direction x in FIG. 9 and the portion of the second thin extension 15B which extends to each side in the direction y in FIG. 9. That is, the second holding portions 43B cover the top surface 151B and the bottom surface 152B of these portions of the second thin extension 15B. Each of the second holding portions 43B also covers a tip of a prescribed portion of the second thin extension 15B.

According to this embodiment again, separation of the first lead 1A and the second lead 1B from the case 4 is prevented. This leads to size reduction of the LED module A4.

By providing two first holding portions 43A, separation of the first lead 1A is more reliably prevented. Arranging the two first holding portions 43A at two corners of the side wall 41 prevents interference of the LED chip 2 with the two first holding portions 43A.

By providing two second holding portions 43B, separation of the second lead 1B is more reliably prevented. Arranging the two second holding portions 43B at two corners of the side wall 41 prevents interference of the above-described capillary with the two second holding portions 43B.

Figure 10:
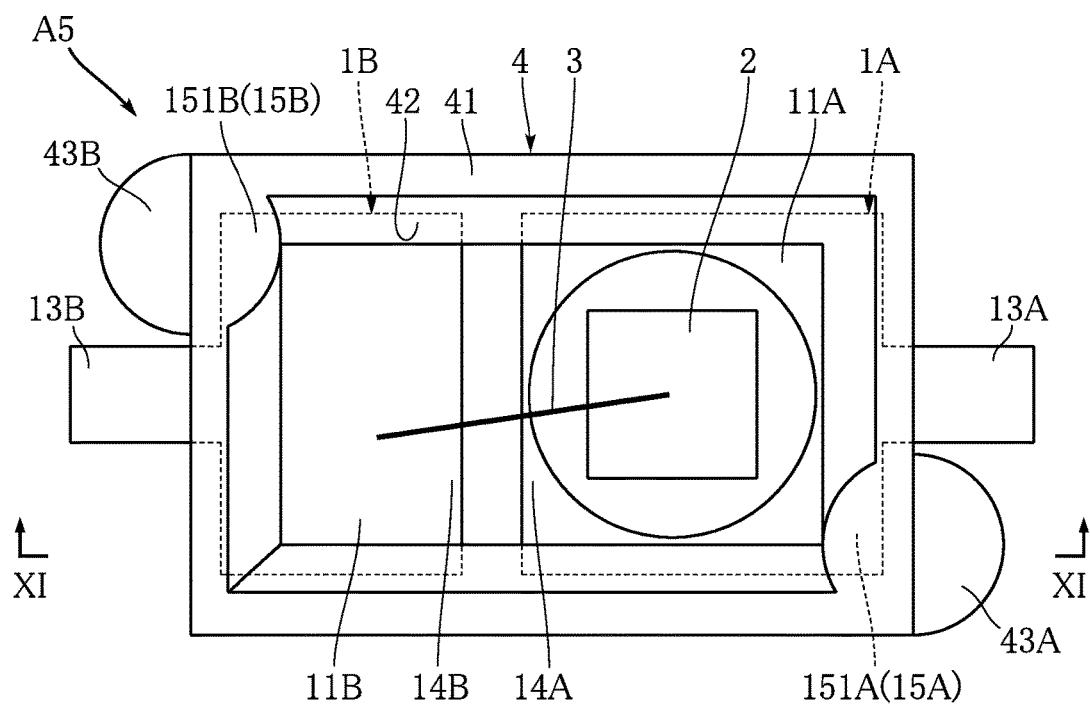
FIG. 10 is a schematic plan view of an LED module according to a fifth embodiment of the present invention.
Figure 11:
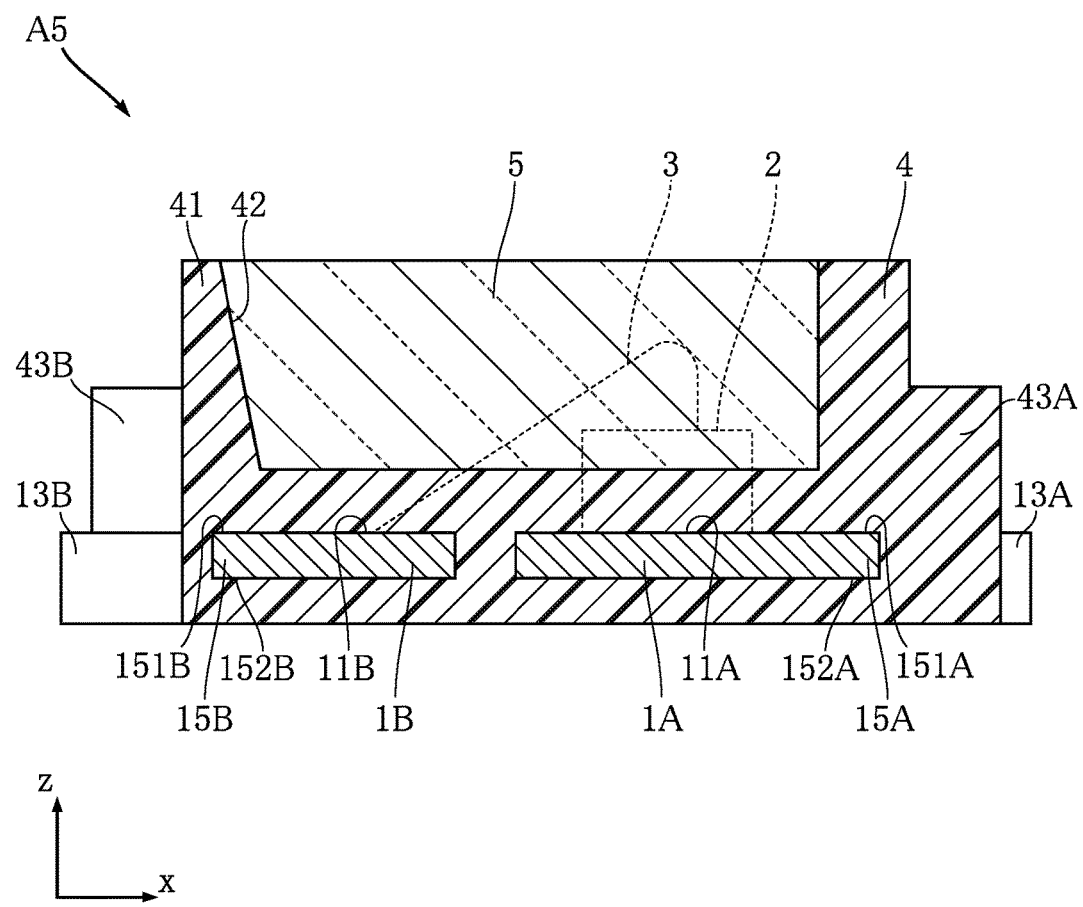
FIG. 11 is a sectional view taken along lines XI-XI in FIG. 10.

FIGS. 10 and 11 show an LED module according to a fifth embodiment of the present invention. The LED module A5 of this embodiment has a case 4 formed with a first holding portion 43A and a second holding portion 43B. FIG. 10 is a schematic plan view of the LED module A5. In FIG. 10, illustration of the sealing resin 5 is omitted.

The first holding portion 43A of this embodiment is circular as viewed in the direction z and its lower part in the direction z is in the form of a round column having a central axis extending in the direction z. The first holding portion 43A is provided at the lower right corner of the rectangular side wall 41 in FIG. 10.

Part of the first holding portion 43A is positioned on the inner side of the side wall 41. As shown in FIG. 11, the upper surface in the direction z of the part of the first holding portion 43A which is on the inner side of the side wall 41 is flush with the upper surface of the side wall 41 in the direction z. A Part of the first holding portion 43A is positioned on the outer side of the side wall 41. The upper surface in the direction z of the part of the first holding portion 43A which is on the outer side of the side wall 41 is lower than the upper surface of the side wall 41 in the direction z, i.e., closer to the reverse surface 12A and is not flush with the upper surface of the side wall 41.

The first holding portion 43A partially covers the portion of the first thin extension 15A which extends to the right in the direction x in FIG. 10 and the portion of the first thin extension 15A which extends downward in the direction y in FIG. 10. That is, the first holding portion 43A covers the top surface 151A and the bottom surface 152A of these portions of the first thin extension 15A. The first holding portion 43A also covers a tip of a prescribed portion of the first thin extension 15A.

The second holding portion 43B of this embodiment is circular as viewed in the direction z and its lower part in the direction z is in the form of a round column having a central axis extending in the direction z. The second holding portion 43B is provided at the upper left corner of the rectangular side wall 41 in FIG. 10.

Part of the second holding portion 43B is positioned on the inner side of the side wall 41. The upper surface in the direction z of the part of the second holding portion 43B which is on the inner side of the side wall 41 is flush with the upper surface of the side wall 41 in the direction z. Part of the second holding portion 43B is positioned on the outer side of the side wall 41. The upper surface in the direction z of the part of the second holding portion 43B which is on the outer side of the side wall 41 is lower than the upper surface of the side wall 41 in the direction z, i.e., closer to the reverse surface 12B and is not flush with the upper surface of the side wall 41. This feature is the same as that of the above-described first holding portion 43A.

The second holding portion 43B partially covers the portion of the second thin extension 15B which extends to the left in the direction x in FIG. 10 and the portion of the second thin extension 15B which extends upward in the direction y in FIG. 10. That is, the second holding portion 43B covers the top surface 151B and the bottom surface 152B of these portions of the second thin extension 15B. The second holding portion 43B also covers a tip of a prescribed portion of the second thin extension 15B.

According to this embodiment again, separation of the first lead 1A and the second lead 1B from the case 4 is prevented. This leads to size reduction of the LED module A5.

Figure 12:
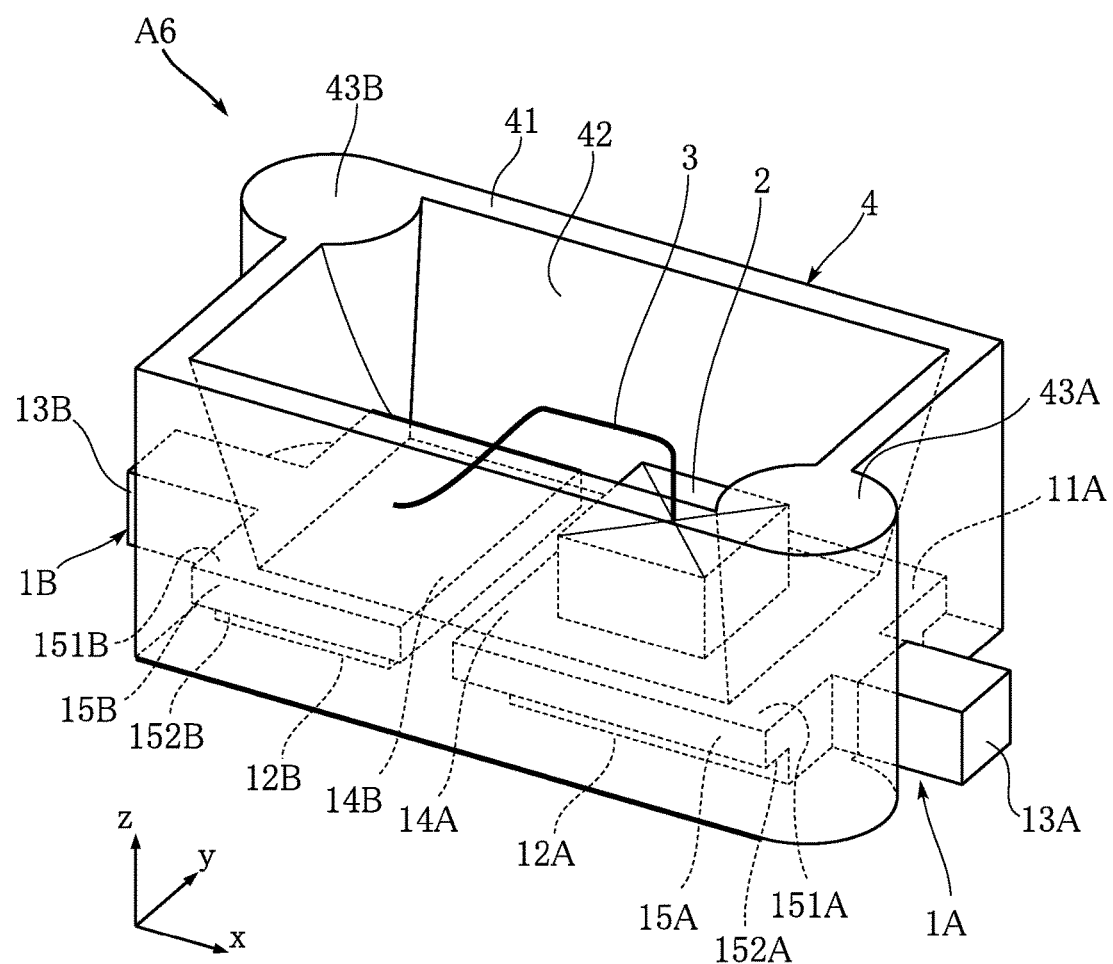
FIG. 12 is a schematic perspective view of an LED module according to a sixth embodiment of the present invention.

FIG. 12 shows an LED module according to a sixth embodiment of the present invention. The LED module A6 of this embodiment is the same as that of the LED module A1 except the structures of the first thin extension 15A of the first lead 1A and the second thin extension 15B of the second lead 1B. FIG. 12 is a perspective view of the LED module A6. For easier understanding, illustration of the sealing resin 5 is omitted in FIG. 12.

The first thin extension 15A of the lead 1A of this embodiment projects to each side in the direction y but does not project in the direction x. The second thin extension 15B of the second lead 1B projects to each side in the direction y but does not project in the direction x.

According to this embodiment again, separation of the first lead 1A and the second lead 1B from the case 4 is prevented. This leads to size reduction of the LED module A6.

Figure 13:
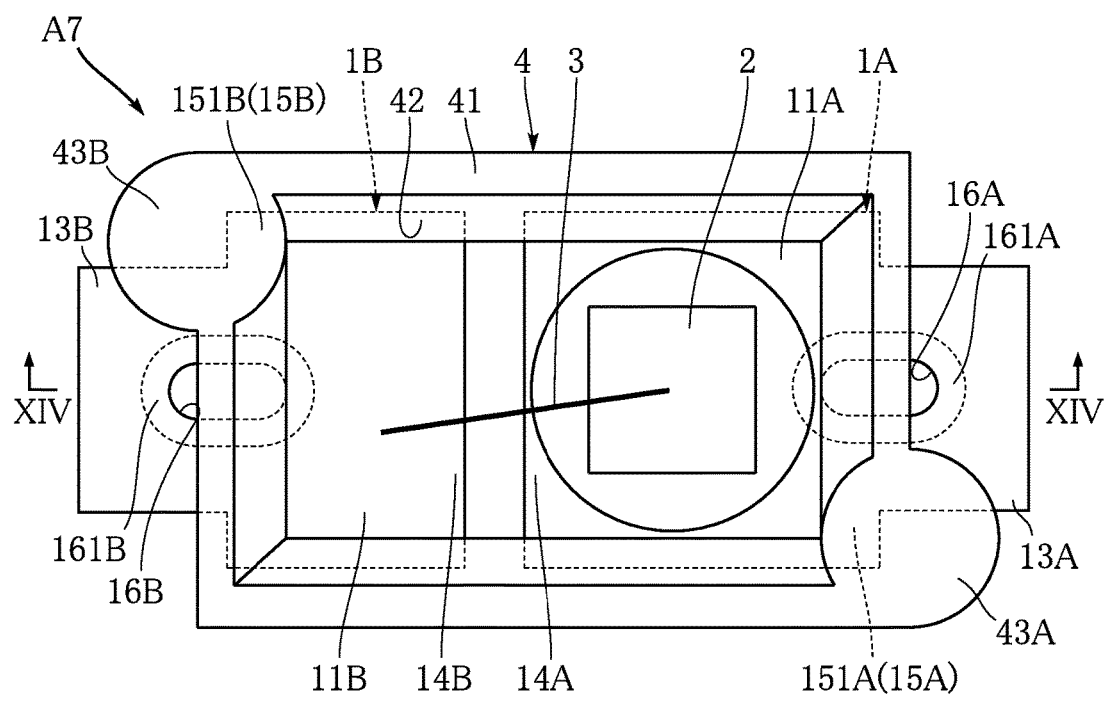
FIG. 13 is a schematic plan view of an LED module according to a seventh embodiment of the present invention.
Figure 14:
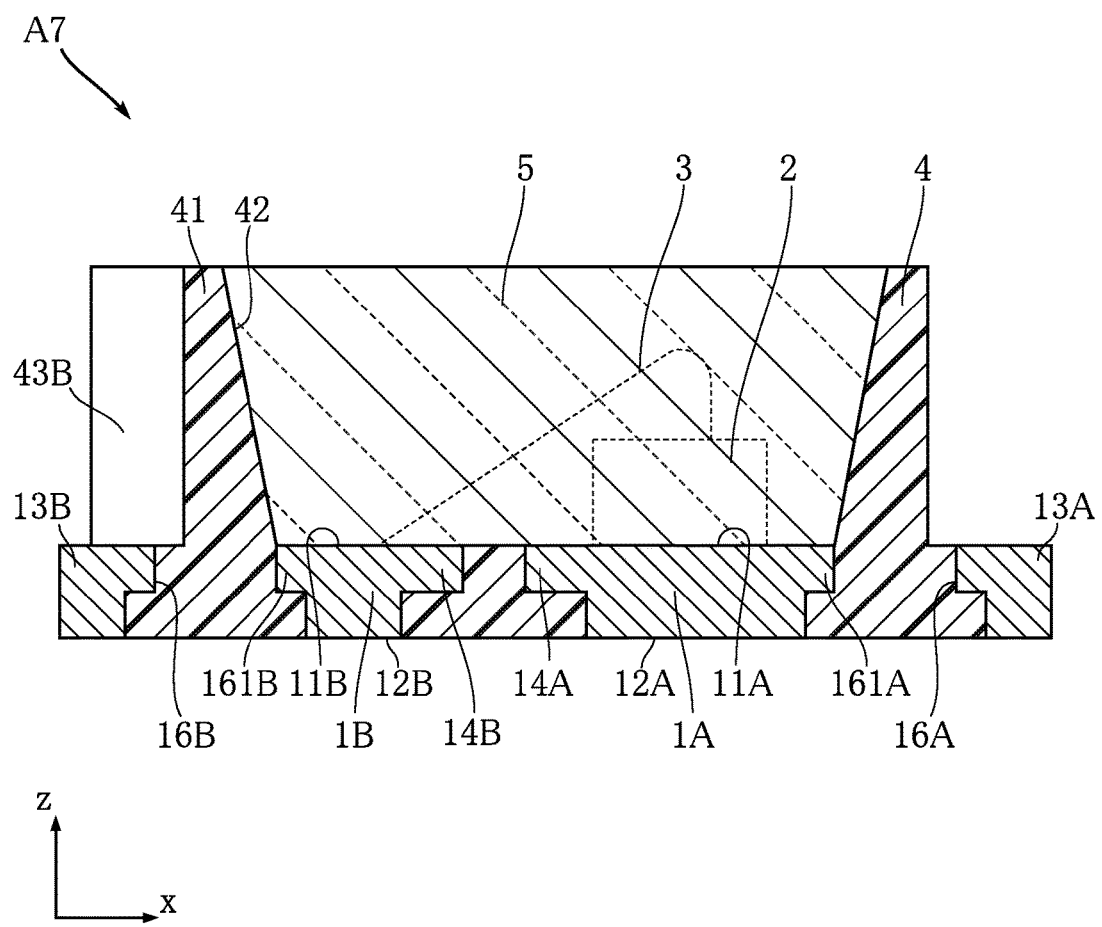
FIG. 14 is a sectional view taken along lines XIV-XIV in FIG. 13.

FIGS. 13 and 14 show an LED module according to a seventh embodiment of the present invention. The LED module A7 of this embodiment differs from the foregoing embodiments in structures of the first lead 1A and second lead 1B. FIG. 13 is a plan view of the LED module A7. For easier understanding, illustration of the sealing resin 5 is omitted in FIG. 13. FIG. 14 is a sectional view of the LED module A7 in the z-x plane taken along lines XIV-XIV in FIG. 13.

In this embodiment, the first lead 1A is formed with a first through-hole 16A. The first through-hole 16A penetrates the first lead 1A in the thickness direction z. As viewed in the direction z, the first through-hole 16A has an oval shape elongated in direction x.

The first lead 1A has an eaved portion 161A. The eaved portion 161A projects inward from the inner edge of the first through-hole 16A at a position adjacent to the obverse surface 11A. The thickness of the eaved portion 161A is smaller than the depth of the first through-hole 16A.

The first through-hole 16A overlaps the side wall 41 of the case 4 as viewed in the direction z. Specifically, a part of the first through-hole 16A is positioned on the inner side of the side wall 41 as viewed in the direction z, while another part of the first through-hole 16A is positioned on the outer side of the side wall 41 as viewed in the direction z. A part of the case 4 is disposed in the first through-hole 16A.

In the illustrated example, the inner edge of the first through-hole 16A adjacent to the obverse surface 11A can be divided into two parts, one located on the right side of the side wall 41 in the x-direction and the other part. The right-side part of the inner edge is exposed to the outside, while the other part is covered by the case 4.

The second lead 1B is formed with a second through-hole 16B. The second through-hole 16B penetrates the second lead 1B in the thickness direction z. As viewed in the direction z, the second through-hole 16B has an oval shape elongated in the longitudinal direction x.

The second lead 1B has an eaved portion 161B. The eaved portion 161B projects inward from the inner edge of the second through-hole 16B at a position adjacent to the obverse surface 11B. The thickness of the eaved portion 161B is smaller than the depth of the second through-hole 16B.

The second through-hole 16B overlaps the side wall 41 of the case 4 as viewed in the direction z. A part of the second through-hole 16B is positioned on the inner side of the side wall 41 as viewed in the direction z, while another part of the second through-hole 16B is positioned on the outer side of the side wall 41 as viewed in the direction z. A part of the case 4 is disposed in the second through-hole 16B.

Like the first through-hole 16A, the inner edge of the second through-hole 16B adjacent to the obverse surface 11B is divided into two parts: one located on the left side of the side wall 41 in the direction x and exposed to the outside; and the other part covered by the case 4.

According to this embodiment again, separation of the first lead 1A and the second lead 1B from the case 4 is prevented. This leads to size reduction of the LED module A7.

Since the first lead 1A has the first through-hole 16A and part of the case 4 is in the first through-hole 16A, the first lead 1A is strongly bonded to the case 4. Provision of the eaved portion 161A also contributes to the strong bonding of the first lead 1A and the case 4.

Since the first through-hole 16A overlaps the side wall 41 of the case 4 as viewed in the direction z, the part of the case 4 which is in the first through-hole 16A is connected to the side wall 41. Thus, the first lead 1A is reliably held by the side wall 41 (which has a relatively high rigidity), so that separation of the first lead 1A is more reliably prevented.

Since the first through-hole 16A has an oval shape including a portion positioned on the outer side of the side wall 41 and a portion positioned on the inner side of the side wall 41, the contact area of the first lead 1A and the case 4 is increased, which is advantageous for preventing separation of the first lead 1A.

Since the second lead 1B has the second through-hole 16B and part of the case 4 is in the second through-hole 16B, the second lead 1B is strongly bonded to the case 4. Provision of the eaved portion 161B also contributes to the strong bonding of the second lead 1B and the case 4.

Since the second through-hole 16B overlaps the side wall 41 of the case 4 as viewed in the direction z, the part of the case 4 which is in the second through-hole 16B is connected to the side wall 41. Thus, the second lead 1B is reliably held by the side wall 41 (which has a relatively high rigidity), so that separation of the second lead 1B is more reliably prevented.

Since the second through-hole 16B has an oval shape including a portion positioned on the outer side of the side wall 41 and a portion positioned on the inner side of the side wall 41, the contact area of the second lead 1B and the case 4 is increased, which is advantageous for preventing separation of the second lead 1B.

Figure 15:
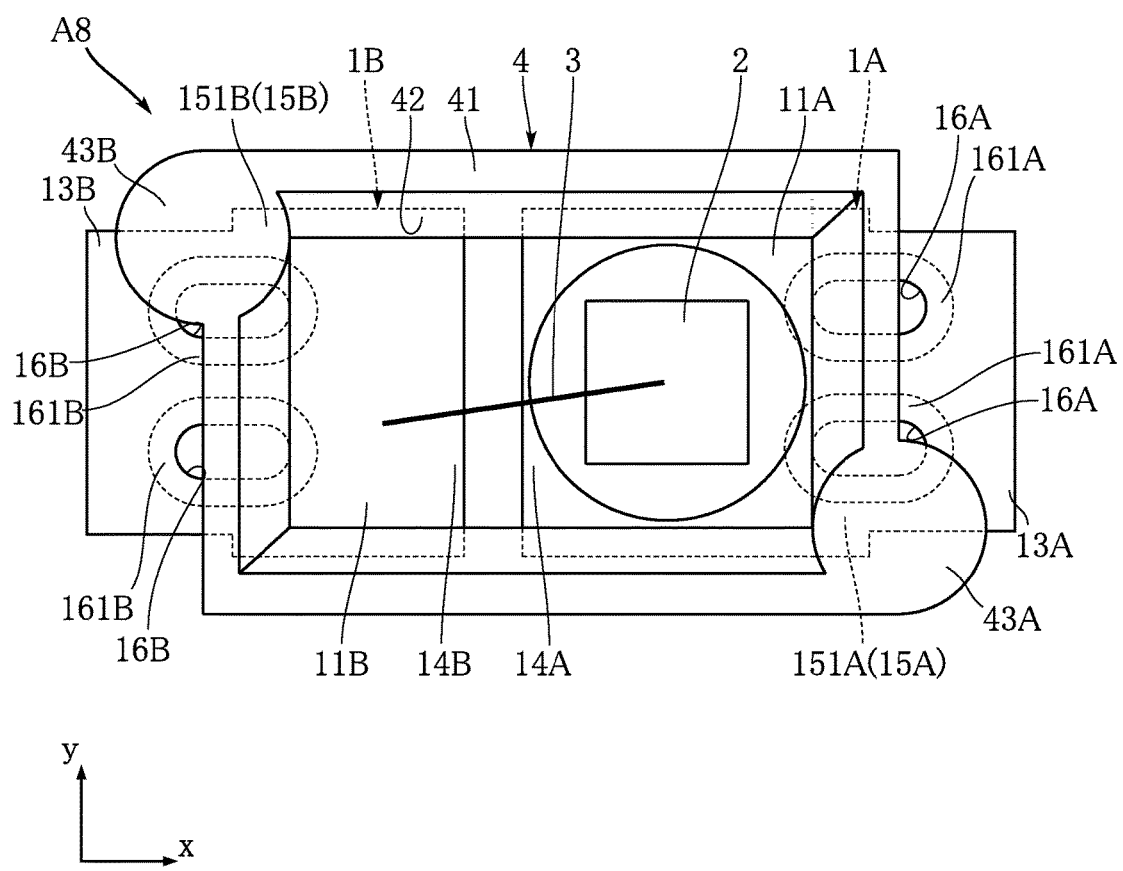
FIG. 15 is a schematic plan view showing an LED module according to an eighth embodiment of the present invention.

FIG. 15 is an LED module according to an eighth embodiment of the present invention. The LED module A8 of this embodiment differs from the LED module A7 in the numbers of first through-holes 16A and second through-holes 16B. FIG. 15 is a plan view of the LED module A8. In FIG. 15, illustration of the sealing resin 5 is omitted.

In this embodiment, the first lead 1A is formed with two first through-holes 16A. Each of the two first through-holes 16A has an oval shape elongated in the direction x. The two first through-holes 16A are arranged side by side in the direction y. The second lead 1B is formed with two second through-holes 16B. Each of the two second through-holes 16B has an oval shape elongated in the direction x. The two second through-holes 16B are arranged side by side in the direction y.

According to this embodiment again, separation of the first lead 1A and the second lead 1B from the case 4 is prevented. This leads to size reduction of the LED module A8. By increasing the number of the first through-holes 16A and the second through-holes 16B, separation of the first lead 1A and the second lead 1B is more reliably prevented.

Figure 16:
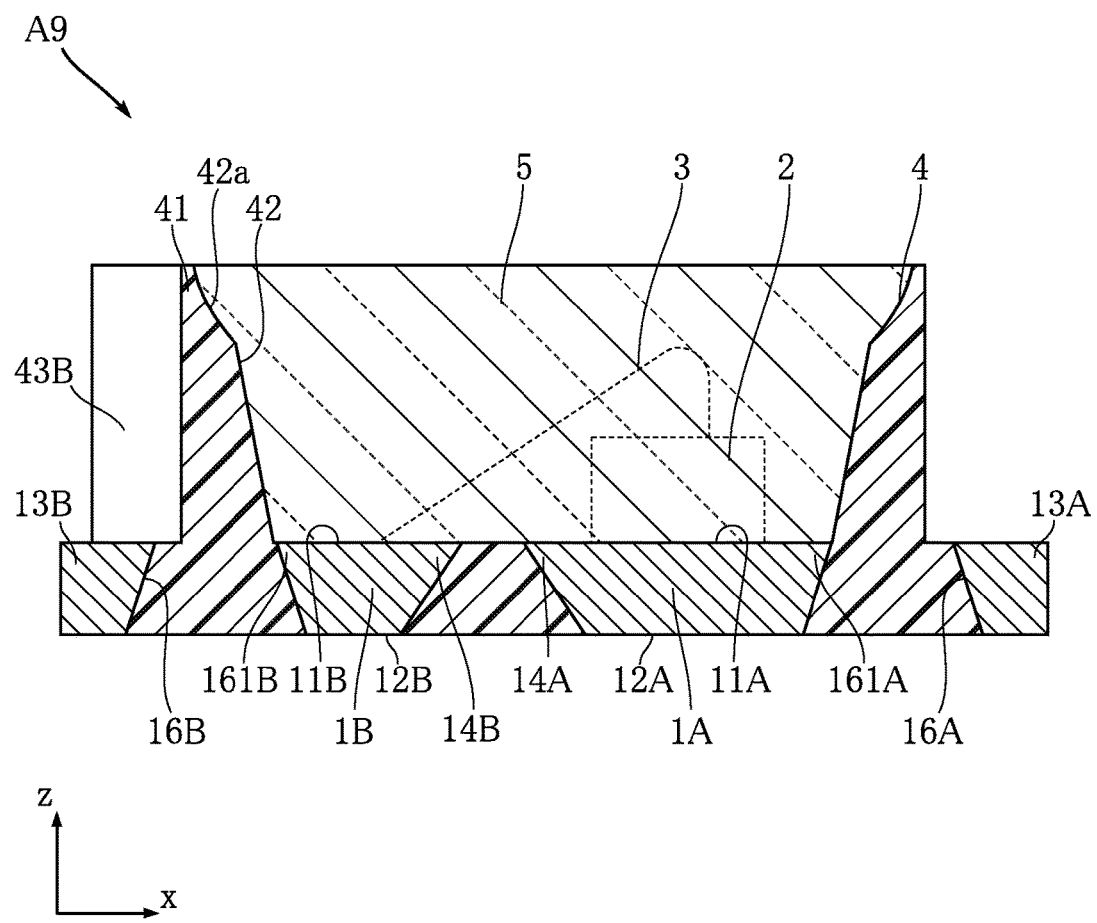
FIG. 16 is a sectional view showing an LED module according to a ninth embodiment of the present invention.

FIG. 16 shows an LED module according to a ninth embodiment of the present invention. FIG. 16 is a sectional view corresponding to the z-x plane along lines XIV-XIV in FIG. 13.

In the LED module A9 of this embodiment, the eaved portion 14A of the first lead 1A has an inclined surface. The inclined surface of the eaved portion 14A is inclined in such a manner as to be deviated to the right in the direction x as proceeding from the obverse surface 11A toward the reverse surface 12A. The eaved portion 161A of the first through-hole 16A also has an inclined surface which is inclined in such a manner as to reduce the dimension, as viewed in the direction z, as proceeding from the obverse surface 11A toward the reverse surface 12A.

Also, the eaved portion 14B of the second lead 1B has an inclined surface. The inclined surface of the eaved portion 14B is inclined in such a manner as to be deviated to the left in the direction x as proceeding from the obverse surface 11B to the reverse surface 12B. The eaved portion 161B of the second through-hole 16B also has an inclined surface which is inclined in such a manner as to reduce the dimension, as viewed in the direction z, as proceeding from the obverse surface 11B toward the reverse surface 12B.

The side wall 41 has a cut surface 42a. The cut surface 42a is disposed on the upper side in the direction z of the side surface 42 and provided along the entire circumference of the side wall 41. The cut surface 42a is a surface that is concave relative to a hypothetical surface as an extension of the side surface 42. By the formation of the cut surface 42a, the area of the upper surface of the side wall 41 in the direction z is reduced. The side wall 41 having a relatively small upper surface in the direction z is advantageous in that an excessive amount of sealing resin 5 does not pile on the side wall 41.

According to this embodiment again, separation of the first lead 1A and the second lead 1B from the case 4 is prevented. This leads to size reduction of the LED module A9.

The first through-holes 16A and the second through-holes 16B of the LED modules A7-A9 can be employed in the LED modules A1-A6 as appropriately combined.

The LED module of the present invention is not limited to the foregoing embodiments. The specific structure of each part of the LED module according to the present invention can be varied in design in many ways.

The invention claimed is:

1. A module comprising:
a support member having a recess that is defined by a side wall of the support member and a bottom surface of the support member;
a semiconductor chip disposed in the recess; and
a first electrode that is electrically connected, in the recess, to the semiconductor chip,
wherein the side wall of the support member is formed with a first protruding portion, a part of which protrudes toward the semiconductor chip as viewed in a normal direction to the bottom surface of the support member,
the support member is formed with a second protruding portion that protrudes away from the semiconductor chip as viewed in the normal direction, and
the first protruding portion includes a convex curved surface that is disposed within the recess and convex toward the semiconductor chip.

2. The module according to claim 1, wherein the first protruding portion has a curved front end.

3. The module according to claim 1, wherein the side wall of the support member has a periphery defined by two pairs of opposing edges and the first protruding portion as viewed in the normal direction.

4. The module according to claim 1, wherein the semiconductor chip is disposed on the first electrode.

5. The module according to claim 1, further comprising a second electrode spaced apart from the first electrode and electrically connected, in the recess, to the semiconductor chip.

6. The module according to claim 1, wherein the side wall of the support member has a part that overlaps with the first electrode as viewed in the normal direction.

7. The module according to claim 1, wherein the first electrode has a part that is flanked by the side wall of the support member as viewed in a direction perpendicular to the normal direction.

8. The module according to claim 1, wherein the second protruding portion includes a convex curved surface that is convex away from the semiconductor chip.

9. The module according to claim 1, wherein the first protruding portion and the second protruding portion overlap with each other as viewed in a first direction that is perpendicular to the normal direction.

10. The module according to claim 1, wherein the support member includes at least one column part, each of the first protruding portion and the second protruding portion is formed by one of the at least one column part.

11. The module according to claim 1, wherein the semiconductor chip is an LED chip.

12. A module comprising:
a support member having a recess that is defined by a side wall of the support member and a bottom surface of the support member;
a semiconductor chip disposed in the recess; and
a first electrode that is electrically connected, in the recess, to the semiconductor chip,
wherein the side wall of the support member is formed with a first protruding portion a part of which protrudes away from the semiconductor chip as viewed in a normal direction to the bottom surface of the support member, and
the first protruding portion includes a convex curved surface that is disposed within the recess and convex toward the semiconductor chip.

13. The module according to claim 12, wherein the first protruding portion has a curved front end.

14. The module according to claim 12, wherein the semiconductor chip is disposed on the first electrode.

15. The module according to claim 12, further comprising a second electrode spaced apart from the first electrode and electrically connected, in the recess, to the semiconductor chip.

16. The module according to claim 12, wherein the side wall of the support member has a part that overlaps with the first electrode as viewed in the normal direction.

17. The module according to claim 12, wherein the first electrode has a part that is flanked by the side wall of the support member as viewed in a direction perpendicular to the normal direction.

18. The module according to claim 12, wherein the support member is formed with a second protruding portion, and the second protruding portion includes a convex curved surface that is convex away from the semiconductor chip.

19. The module according to claim 18, wherein the first protruding portion and the second protruding portion overlap with each other as viewed in a first direction that is perpendicular to the normal direction.

20. The module according to claim 18, wherein the support member includes at least one column part, each of the first protruding portion and the second protruding portion is formed by one of the at least one column part.

* * * * *